(12) United States Patent
Wang et al.

(10) Patent No.: US 10,136,538 B2
(45) Date of Patent: Nov. 20, 2018

(54) ELECTRONIC ELEMENT SUPPORT FRAME, ELECTRONIC ELEMENT ASSEMBLY, AND ELECTRICAL ASSEMBLY

(71) Applicants: TYCO ELECTRONICS (SHANGHAI) CO. LTD., Shanghai (CN); TYCO ELECTRONICS TECHNOLOGY (SIP) LTD., Suzhou (CN)

(72) Inventors: Jifa Wang, Suzhou (CN); Xiao Zhou, Shanghai (CN); Cancan Zhao, Shanghai (CN); Haomai Yin, Shanghai (CN)

(73) Assignees: Tyco Electronics (Shanghai) Co., Ltd., Shanhai (CN); Tyco Electronics Technology (SIP) Co., Ltd., Suzhou (CN)

( * ) Notice: Subject to any disclaimer, the term of this patent is extended or adjusted under 35 U.S.C. 154(b) by 0 days.

(21) Appl. No.: 15/939,589

(22) Filed: Mar. 29, 2018

(65) Prior Publication Data

US 2018/0288893 A1 Oct. 4, 2018

(30) Foreign Application Priority Data

Mar. 31, 2017 (CN) .................... 2017 2 0337480 U

(51) Int. Cl.
*H02B 1/01* (2006.01)
*H05K 7/10* (2006.01)

(52) U.S. Cl.
CPC ................................ *H05K 7/1084* (2013.01)

(58) Field of Classification Search
CPC .................................................... H05K 7/1084
USPC ........................................................... 361/825
See application file for complete search history.

(56) References Cited

U.S. PATENT DOCUMENTS

| | | | | |
|---|---|---|---|---|
| 5,367,499 A | * | 11/1994 | Morningstar | B63B 21/66 174/101.5 |
| 7,264,372 B2 | * | 9/2007 | Maglica | F21L 4/005 362/188 |
| 9,722,333 B2 | * | 8/2017 | Halbig | B60R 16/023 |
| 2013/0074722 A1 | * | 3/2013 | Andersen | F42B 3/127 102/202.14 |

* cited by examiner

*Primary Examiner* — Hung S Bui
(74) *Attorney, Agent, or Firm* — Saxton & Stump LLC

(57) ABSTRACT

The present disclosure discloses an electronic element support frame, an electronic element assembly, and an electrical assembly. The electronic element support frame has a body, an isolative wall, and a pair of retaining parts. The body has an axial direction. The isolative wall is arranged to continuously extend along the axial direction of the body. The pair of retaining parts are arranged on the body and disposed at two sides of the isolative wall, respectively. The retaining parts together with the isolative wall enclose a pair of accommodating parts, respectively. The accommodating parts extend continuously along the axial direction of the isolative wall to accommodate pins of the electronic element, respectively. The electronic element support frame of the present disclosure can avoid erroneous contact between the pins of the electronic element, thereby enhancing safety performance.

20 Claims, 19 Drawing Sheets

ELECTRONIC ELEMENT SUPPORT FRAME, ELECTRONIC ELEMENT ASSEMBLY, AND ELECTRICAL ASSEMBLY

FIELD OF THE INVENTION

The present disclosure relates to a structure for supporting an electronic element, and more particularly to an electronic element support frame, electronic element assembly, and electrical assembly.

BACKGROUND OF THE INVENTION

An electronic element is useful for implementing a specific electric function. To implement corresponding electric transmission, the electronic element is generally electrically connected to other devices via pins, thereby implementing transmission of electrical signals. To meet requirements for input/output or connection to positive and negative poles, the electronic element generally requires a pair of pins. Erroneous contact of the pair of pins will cause loss of the functions of the electronic element. The pins are generally made of a relatively flexible material such that their extension paths easily change, which will very easily cause the erroneous contact of the pins. How to guarantee that the pins will not contact erroneously is an issue to address.

SUMMARY OF THE INVENTION

One of the objectives of the present disclosure is to provide an electronic element support frame, electronic element subassembly, and electrical subassembly, which avoids erroneous contact between pins, to thereby overcome the drawbacks of the prior art.

According to a first aspect of the present disclosure, an electronic element support frame is provided. The electronic element support frame comprises a body, an isolative wall, and a pair of retaining parts. The body has an axial direction. The isolative wall is arranged to continuously extend along the axial direction of the body. The pair of retaining parts are arranged on the body and disposed at two sides of the isolative wall, respectively. The retaining parts together with the isolative wall enclose a pair of accommodating parts, respectively. The accommodating parts extend continuously along the axial direction of the isolative wall to accommodate pins of the electronic element, respectively.

In an embodiment of the electronic element support frame according to the present disclosure, the isolative wall has an axial length larger than that of the retaining parts. One or two ends of the isolative wall are arranged to axially protrude from the retaining parts. In another embodiment, the isolative wall is arranged to continuously extend along a radial direction of the body; and when the pins of the electronic elements are accommodated into the accommodating parts, a top portion of the insulative wall is arranged to protrude from peripheral walls of the pins of the electronic element. Additionally or alternatively, the accommodating parts are through-holes or U-shaped grooves.

In some embodiments, the electronic element support frame further comprises mating retaining parts. The mating retaining parts are arranged on the retaining parts. In a preferred embodiment, the mating retaining parts and the retaining parts constitute an entire unit. In another preferred embodiment, the electronic element support frame further comprises a rotational connector. The rotational connector is connected to the retaining parts and the mating retaining parts, respectively, and the retaining parts and the mating retaining part are arranged to be rotatable with respect to each other via the rotational connector. In some other preferred embodiments, the mating retaining parts have a pair of mating accommodating parts. The mating accommodating parts are arranged to be communicatible with the accommodating parts and enclose a through-hole. More preferably, the mating retaining parts are arranged to be movable relative to the retaining parts and enable the mating accommodating parts to move to be staggered with the accommodating parts. Additionally or alternatively, a mating isolative wall is arranged between the pair of the mating accommodating parts. The mating isolative wall and the isolative wall are arranged to continuously contact along the axial direction. Additionally or alternatively, a recess is arranged between the pair of the mating accommodating parts. The isolative wall protrudes and extends into the recess. In yet another preferred embodiment, a pair of blocking parts are protrudingly provided on the mating retaining parts. When the retaining parts and the mating retaining parts are fitted to each other, the pair of the blocking parts are arranged to protrude and extend into the pair of the accommodating parts, respectively. More preferably, the accommodating parts are U-shaped grooves; and a depth of the U-shaped grooves is arranged to be larger than or equal to a radial size of the pins of the electronic element.

In some other embodiments, the electronic element support frame further comprises a mounting end portion. The mounting end portion is provided at an end portion of the body and extends continuously along the axial direction of the body. The mounting end portion is arranged for being mounted to a mating support. Preferably, the mounting end portion comprises a second isolative wall and a pair of second retaining parts. The second retaining parts are arranged at two sides of the second isolative wall, respectively, and enclose second accommodating parts for accommodating the pins of the electronic element, respectively. The second accommodating parts and the accommodating parts are arranged to communicate along an axial direction of the isolative wall. Alternatively, an axial end face of the retaining parts facing the mounting end portion is a blocking surface.

In any of the above-mentioned embodiments, the electronic element support frame is an injection-molded unit.

According to a second aspect of the present disclosure, an electronic element assembly is further provided. The electronic element assembly comprises an electronic element and the electronic element support frame according to any of the abovementioned. The electronic element comprises a pair of pins. The pins are correspondingly arranged in the accommodating parts, respectively.

In a preferred embodiment of the electronic element assembly, the pins include a bare metal wire. In another preferred embodiment, the electronic element further comprises an element body. The element body is arranged adjacent to an end portion of the body. The pair of pins are arranged to continuously extend from the element body. In some other preferred embodiments, the electronic element is a temperature detecting element. More preferably, the electronic element is a thermistor. Alternatively, the electronic element is a negative temperature coefficient thermistor.

According to a third aspect of the present disclosure, an electrical assembly is also provided. The electrical assembly comprises a mating support and the electronic element assembly according to any of the abovementioned. The electronic element support and the mating support are arranged to be matingly and integrally assembled.

In some embodiments of the electrical assembly, the mating support has a mounting hole wall. The mounting hole wall encloses a mounting hole. One end of the electronic element support is inserted into the mounting hole. Preferably, the mating support further comprises a connecting part. One end of the mounting hole wall is connected to the connecting part. The connecting part may be arranged to be connected to a detected element. More preferably, the mating support is a metallic whole unit. Even more preferably, the electrical assembly further comprises a filler. The filler is arranged to fill the mounting hole.

Compared with the prior art, the electronic element support frame according to the present disclosure accommodates the pins through a pair of accommodating parts, respectively, which avoids erroneous contact between the two pins. The isolative wall may enhance the electric insulation performance and the voltage-withstanding performance between the two pins and further enhance safety and stability of the electronic element. The electronic element support frame has a simplified manufacturing process and is easy to be assembled with the electronic element without additional protection processing to the pins and additional protection part, thereby reducing the manufacturing cost while enhancing the safe and stable performance.

DETAILED DESCRIPTION OF EMBODIMENTS

Figure 1:
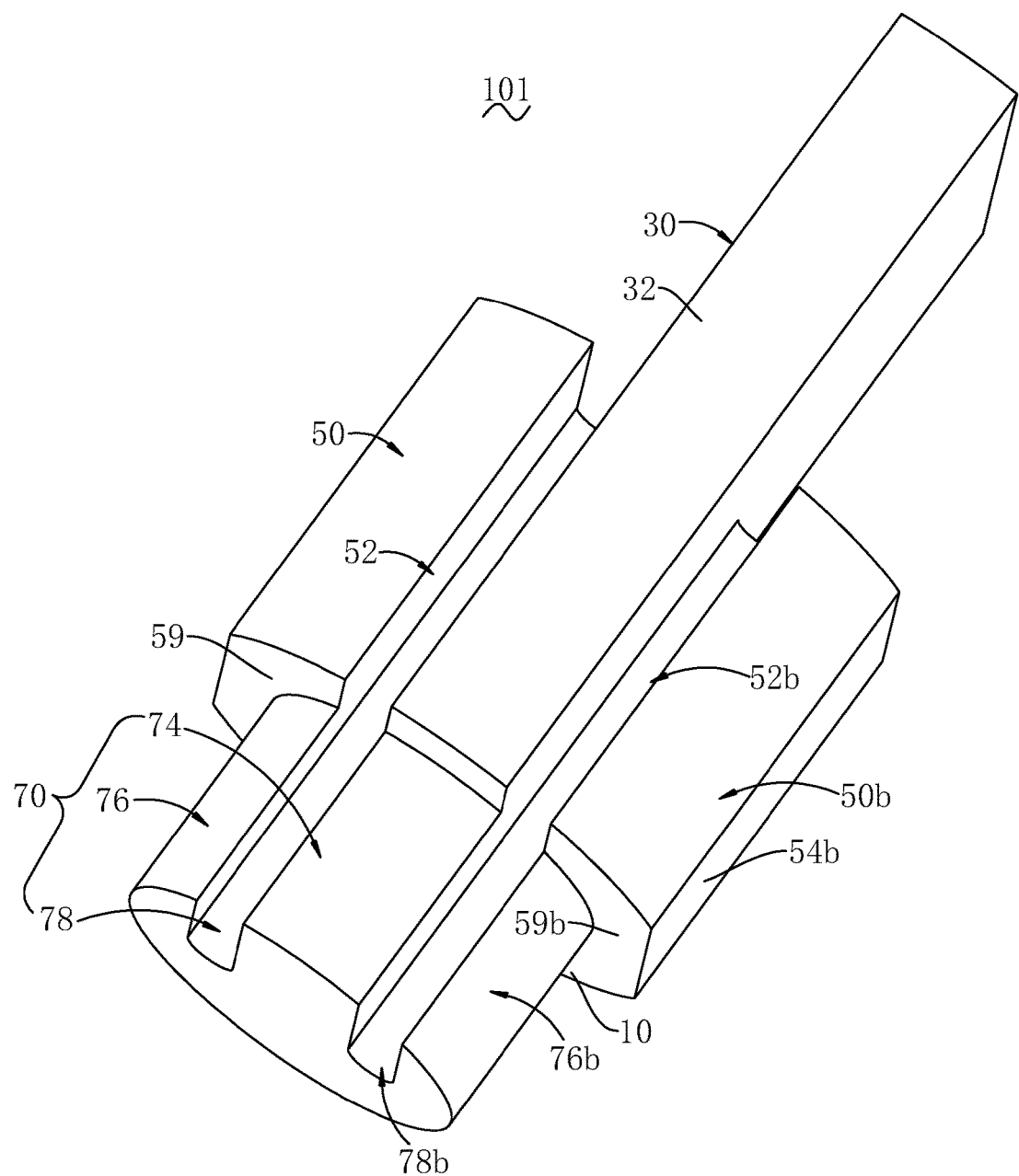
FIG. 1 is a stereoscopic structural diagram of an electronic element support frame provided by the present disclosure.

Hereinafter, the present disclosure will be described in detail with reference to the accompanying drawings:

Embodiment 1

With reference to FIGS. 1-10, the present disclosure provides an electronic element support frame 101. The electronic element support frame 101 comprises an isolative wall 30 and a pair of retaining parts 50, 50b. The pair of retaining parts 50, 50b are arranged at two sidewalls of the isolative wall 30, respectively, and together with the sidewalls of the isolative wall 30 enclose a pair of accommodating parts 52, 52b.

The electronic element support frame 101 comprises a body 10. The body 10 is arranged for supporting the isolative wall 30 and the pair of retaining parts 50, 50b. The body 10 is arranged to extend along an axial direction of the electronic element support frame 101. In other words, the body 10 has an axial direction. The specific structure and shape of the body 10 are only required to meet corresponding support requirements. In this embodiment, to facilitate being mounted to other components, a bottom face of the body 10 is substantially a partial cylindrical face. A top face of the body 101 may be a plane.

The isolative wall 30 is arranged for preventing erroneous contact of a pair of pins 84, 84b (as will be described infra) retained by the pair of retaining parts 50, 50b to thereby enhance electrical insulation performance between the pair of pins 84, 84b and reduce electromagnetic interference. The isolative wall 30 is disposed on the body 10 and arranged to continuously extend along the axial direction of the electronic element support frame 101. The specific extending direction, dimensional specification, and shape of the isolative wall 30 are only required to prevent erroneous contact of the corresponding pair of pins 84, 84b and to enhance the electrical insulation and voltage-withstanding performance between the pins 84, 84b. In this embodiment, to facilitate manufacturing and obtain even electrical isolation performance, the isolative wall 30 is substantially rectangular plate-shaped. To enhance the electrical isolation performance of the isolative wall 30, a top portion 32 and/or a bottom portion 34 of the isolative wall 30 are arranged to radially protrude from the retaining parts 50, 50b. In an embodiment, the top portion 32 and the bottom portion 34 of the isolative wall 30 are both arranged to protrude from a periphery of the pins 84, 84b, thereby exceeding a corresponding creepage distance requirement. To further enhance point isolation performance of the isolative wall 30, the isolative wall 30 has an axial length greater than that of the retaining parts 50, 50b. A front end 36 and/or a rear end 38 of the isolative wall 30 are arranged to axially protrude from the retaining parts 50, 50b. In this embodiment, the rear end 38 of the isolative wall 30 protrudes from the retaining parts 50, 50b to facilitate mutual electrical insulation between the pair of pins 84, 84b extending in a throw line manner. Preferably, to facilitate an electrical connection with other components, the pins 84, 84b comprise a bare metal wire. In other words, the metal wire is not wrapped by insulative wrapper. At this point, a structure such as the isolative wall 30 or the like may be particularly suitable for insulative isolation of the bare metal wires.

The pair of retaining parts 50, 50b are arranged on the body 10, and the pair of retaining parts 50, 50b are arranged at both sides of the isolative wall 30, respectively. In other words, the pair of retaining parts 50, 50b are arranged apart along a transverse direction of the electronic element support frame 101. The specific shape and structure of the pair of retaining parts 50, 50b are only required to enable the pins 84, 84b to be supported and retained. Two radial ends of the retaining parts 50, 50b extend beyond the isolative wall 30. To sufficiently save space, one end of the retaining parts 50, 50b is flush with a front end of the isolative wall 30.

The pair of retaining parts 50, 50b may be a structure such as a snap-joint, a boss, etc. In this embodiment, the pair of retaining parts 50, 50b have accommodating parts 52, 52b for accommodating the pins 84, 84b. To enhance the performance of stabilizing and retaining electronic elements 80, 80b, the accommodating parts 52, 52b may be interference-fitted with the corresponding pins 84, 84b to abut against each other to thereby provide support for an element body 82 of the electronic element 80 by supporting and retaining the pins 84, 84b, which further spares an additional structure to support the element body 82. It may be understood that the retaining parts 50, 50b may be substantially L-shaped so as to thereby together with the sidewalls of the isolative wall 30 enclose the accommodating parts 52, 52b. The depth size of the accommodating parts 52, 52b is only required to satisfy isolation of the pins 84, 84b. In this embodiment, the retaining parts 50, 50b, the body 10, and the isolative wall 30 enclose the accommodating parts 52, 52b.

To facilitate mounting the electronic element support frame 101 and prevent excessive mounting, front end faces 59, 59b of the retaining parts 50, 50b are blocking surfaces. In this embodiment, the front end faces 59, 59b of the retaining parts 50, 50b are arranged to radially protrude with respect to a mounting end portion 70 described below. In this embodiment, the front end faces 59, 59b of the retaining parts 50, 50b face towards the mounting end portion 70 (as will be described infra) to be axially block-fittable with a mating support frame 90 (as will be described infra) when integrally assembled with the mating support frame 90.

The specific shape and configuration of the accommodating parts 52, 52b are only required to limit and retain the pins 84, 84b. In this embodiment, to facilitate mounting the pins 84, 84b as much as possible, the accommodating parts 52, 52b are grooves. More specifically, to facilitate assembling the corresponding pins 84, 84b, the accommodating parts 52, 52b are through-grooves passing through the retaining parts 50, 50b along an axial direction of the isolative wall 30. Of course, the accommodating parts 52, 52b may also be a snap-joint for snap-fitting to retain the pins 84, 84b. The accommodating parts 52, 52b may be through-holes.

To enhance the performance of limiting and retaining the electronic element support frame 101, the retaining parts 50, 50b have positioning faces 54, 54b. The positioning faces 54, 54b are arranged for transversely limit-fitting with an adhesive-cured structure (not shown). The positioning faces 54, 54b extends along a plane defined by the radial direction and the axial direction of the isolative wall 30.

To facilitate the arrangement of the electronic element support frame 101 on the mating support frame 90, the electronic element support frame 101 further comprises a mounting end portion 70. The mounting end portion 70 is arranged at the front end of the isolative wall 30 and is arranged to continuously extend along the axial direction of the isolative wall 30. In other words, the mounting end portion 70 is arranged to axially protrude from the front end of the isolative wall 30. To facilitate mounting in place, the mounting end portion 70 has a radial size and/or a transverse size smaller than those of the retaining parts 50, 50b. The mounting end portion 70 may further be provided with a structure such as a mounting hole, a mounting groove or a snap joint (not shown) or the like to retain the element body 82. In this embodiment, to simplify the structure and facilitate mounting, the mounting end portion 70 and the element body 82 are axially oppositely arranged. The mounting end portion 70 is substantially column-shaped.

To further enhance the performance of insulating and retaining the pins 84, 84b, the mounting end portion 70 comprises a second isolative wall 74 and a pair of second retaining parts 76. The pair of second retaining parts 76 are arranged at two sidewalls of the second isolative wall 74, respectively. The second isolative wall 74 and the second retaining parts 76 are both arranged to extend along the axial direction of the isolative wall 30. When the mounting end portion 70 and the element body 82 are axially oppositely arranged, the pair of second retaining parts 76, 76b are arranged for retaining the pins 84, 84b extending from the element body 82. Correspondingly, the size and structure of the second isolative wall 74 are only required to be identical to those of the isolative wall 30. The pair of second retaining parts 76, 76b together with the second insulative wall 74 enclose second accommodating parts 78, 78b, respectively. The second accommodating parts 78, 78b and the corresponding accommodating parts 52, 52b are axially oppositely arranged. The second accommodating parts 78, 78b may have specific structures identical to or different from those of the accommodating parts 52, 52b. In this embodiment, the second accommodating parts 78, 78b are grooves identical to the accommodating parts 52, 52b and are axially communicative with each other.

To prevent the mounting end portion 70 from being excessively mounted to a mating support 90 (as will be described infra), the mounting end portion 70 has a transverse size and/or a radial size smaller than those of the retaining parts 50, 50b. In other words, the retaining parts 50, 50b are arranged to protrude relative to the transverse direction and/or radial direction of the mounting end portion 70. In this embodiment, the mounting end portion 70 and the isolative wall 30 are coaxially provided. The mounting end portion 70 is substantially cylindrical.

To facilitate manufacturing and enhance the overall performance, the electronic element support frame 101 is an entire unit. Specifically, the electronic element support frame 101 is an injection-molded unit.

Embodiment 2

With reference to FIGS. 11-14, as a variation to Embodiment 1, the present disclosure provides another electronic element support frame 101b. Different from Embodiment 1, a pair of retaining parts 50, 50b of the electronic element support frame 101b are provided with through-holes 55, 55*b*. The through-holes 55, 55*b* are arranged for retaining the pins 84, 84*b*. During mounting, the pins 84, 84*b* may be directly inserted into the through-holes 55, 55*b*. The electronic element support frame 101*b* may be integrally column-shaped.

Embodiment 3

With reference to FIGS. 15-20, as another variation to Embodiment 1, the present disclosure provides yet another electronic element support frame 101*c*. Different from Embodiment 1, the electronic element support frame 101*c* comprises retaining parts 56, 56*b* and mating retaining parts 58, 58*b* that may be disposed opposite to each other.

Specifically, the retaining parts 56, 56*b* are provided with accommodating parts 52*c*, 52*d*. The accommodating parts 52*c*, 52*d* are transversely arranged apart along the isolative wall 30. The accommodating parts 52*c*, 52*d* are arranged to retain the corresponding pins 84, 84*b*. The accommodating parts 52*c*, 52*d* are arranged to axially extend along the insulative wall 30. In this embodiment, the accommodating parts 52*c*, 52*d* are bottom portion grooves. The accommodating parts 52*c*, 52*d* may be axially through-grooves.

The mating retaining parts 58, 58*b* are arranged to up-down abut against the retaining parts 56, 56*b*. The mating retaining parts 58, 58*b* have mating accommodating parts 52*e*, 52*f*. The mating accommodating parts 52*e*, 52*f* and the accommodating parts 52*c*, 52*d* are through-holes 57, 57*b* for accommodating the pins 84, 84*b*.

The electronic element support frame 101*c* forms an isolative wall 30*b* through a mating isolative wall 30*c* and the isolative wall 30. The mating isolative wall 30*c* and the isolative wall 30 are oppositely disposed. To enhance electrical insulation performance, the mating isolative wall 30*c* is arranged to contact the isolative wall 30.

To facilitate manufacturing and assembling operations, the mating isolative wall 30*c* and the mating retaining parts 58, 58*b* constitute an entire unit. Of course, the mating isolative wall 30*c* may also be linked to the mating retaining parts 58, 58*b*. In this embodiment, the mating isolative wall 30*c* and the mating retaining parts 58, 58*b* are an injection-molded whole unit.

Correspondingly, the isolative wall 30 and the retaining parts 56, 56*b* constitute an entire unit. Specifically, the isolative wall 30 and the retaining parts 56, 56*b* constitute an injection-molded whole unit.

To facilitate assembling and/or disassembling the pins 84, 84*b*, the mating retaining parts 58, 58*b* are arranged to be movable relative to the retaining parts 56, 56*b*, and the mating accommodating parts 52*e*, 52*f* are arranged to move to separate from the accommodating parts 52*c*, 52*d*.

To facilitate the arrangement of the mating retaining parts 58, 58*b* to be movable relative to the retaining parts 56, 56*b*, the electronic element support frame 101*c* further comprises a rotational connector 60. The rotational connector 60 is connected to the retaining parts 56, 56*b* and the mating retaining parts 58, 58*b*, respectively. The mating retaining parts 58, 58*b* and the retaining parts 56, 56*b* are arranged to be rotatable through the rotational connector 60. As needed, at least one of the retaining parts 56, 56*b* and the mating retaining parts 58, 58*b* is arranged to rotate around a rotational axis extending along an axial or radial direction of the isolative wall 30. In this embodiment, the mating retaining parts 58, 58*b* are arranged to rotate about the axial rotational axis relative to the retaining parts 56, 56*b*. The rotational connector 60 may be a hinge. As a variation, the rotational connector 60 may also be a rotational axis. Of course, the rotational connector 60 may simply be an elastic deformation structure enabling rotation and bend. In this embodiment, the rotational connector 60, the retaining parts 56, 56*b*, and the mating retaining parts 58, 58*b* are formed into an injection-molded whole unit to implement a rotational connection. Correspondingly, as shown in the figure, the mating retaining parts 58, 58*b* may be arranged to flip rearwardly and upwardly. The structures of the mating retaining parts 58, 58*b* and the retaining parts 56, 56*b* are only required to implement retaining the pins 84, 84*b*. In this embodiment, the mating retaining parts 58, 58*b* and the retaining parts 56, 56*b* are symmetrically arranged. Specifically, all the mating retaining parts 58, 58*b* and the retaining parts 56, 56*b* are semi-cylindrical. In this embodiment, to simplify the manufacturing process, a pair of the retaining parts 56, 56*b* are integrally connected to form a base. A pair of the mating retaining parts 58, 58*b* are integrally connected to form a top cover.

Preferably, the mating retaining parts 58, 58*b* and the retaining parts 56, 56*b* are arranged to be movable so that the mating accommodating parts 52*e*, 52*f* move to be staggered with the accommodating parts 52*c*, 52*d*. In this embodiment, the mating accommodating parts 52*e*, 52*f* may relatively move to be staggered with the accommodating parts 52*c*, 52*d* along a transverse direction of the body 10.

Figure 18:
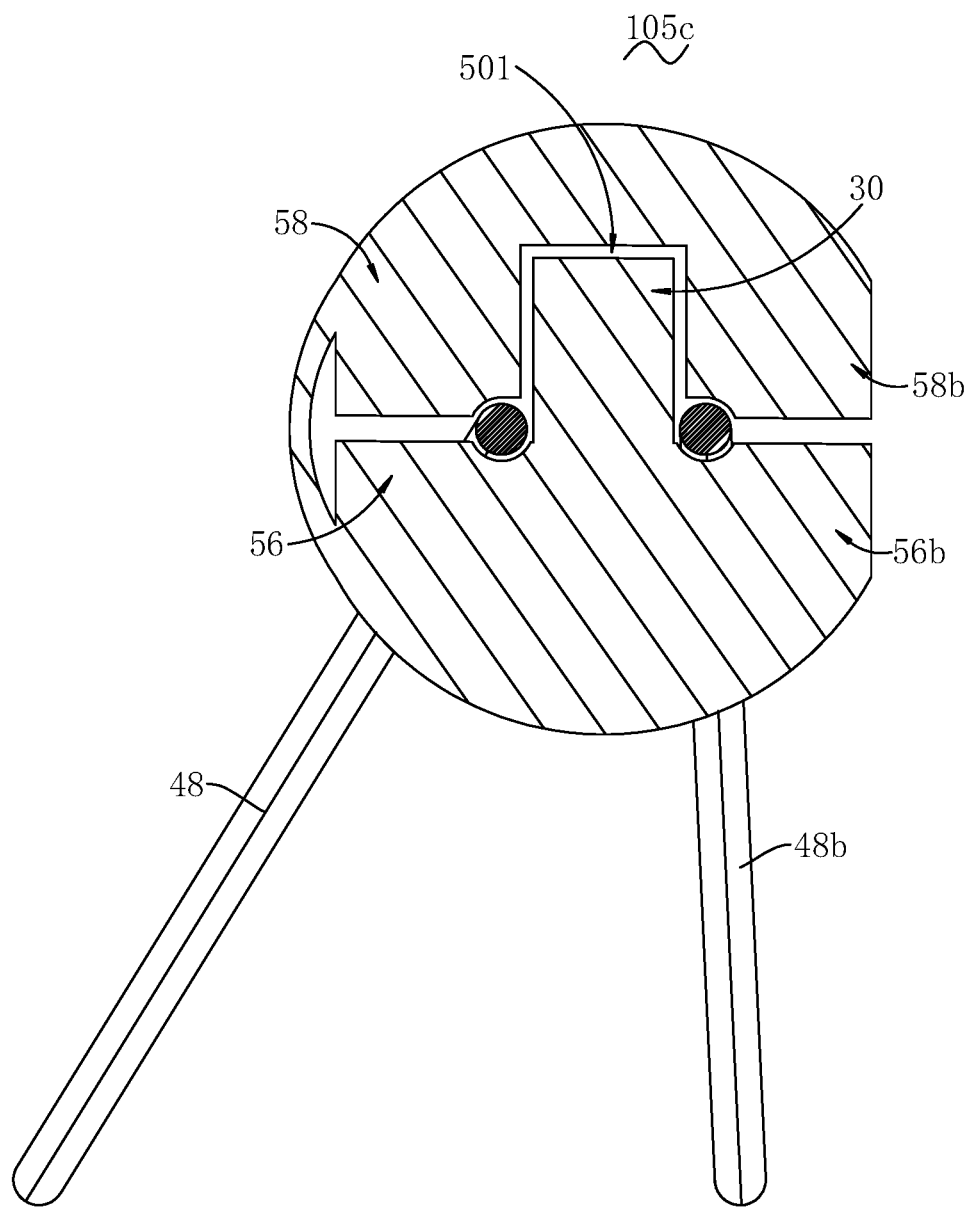
FIG. 18 is a sectional view of the electronic element assembly of FIG. 17 along an H-H line.
Figure 19:
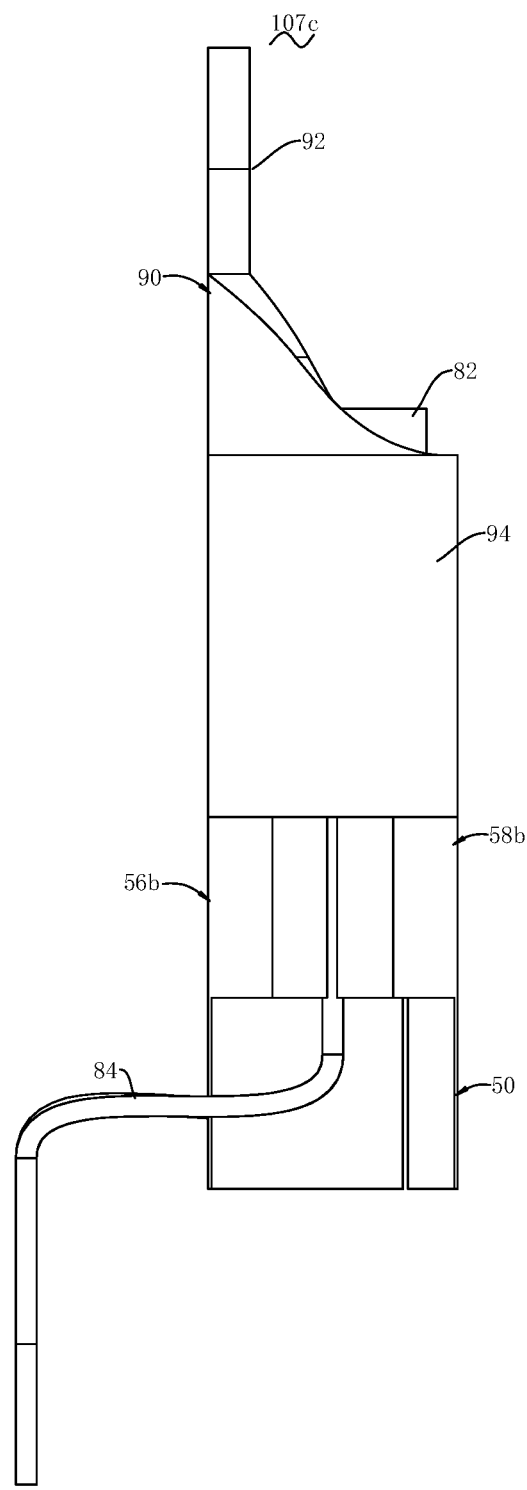
FIG. 19 is a projected view of yet another embodiment of the electrical assembly provided by the present disclosure from one sidewall to the other sidewall of the isolative wall, the electrical assembly comprising the electronic element assembly of FIG. 17.
Figure 20:
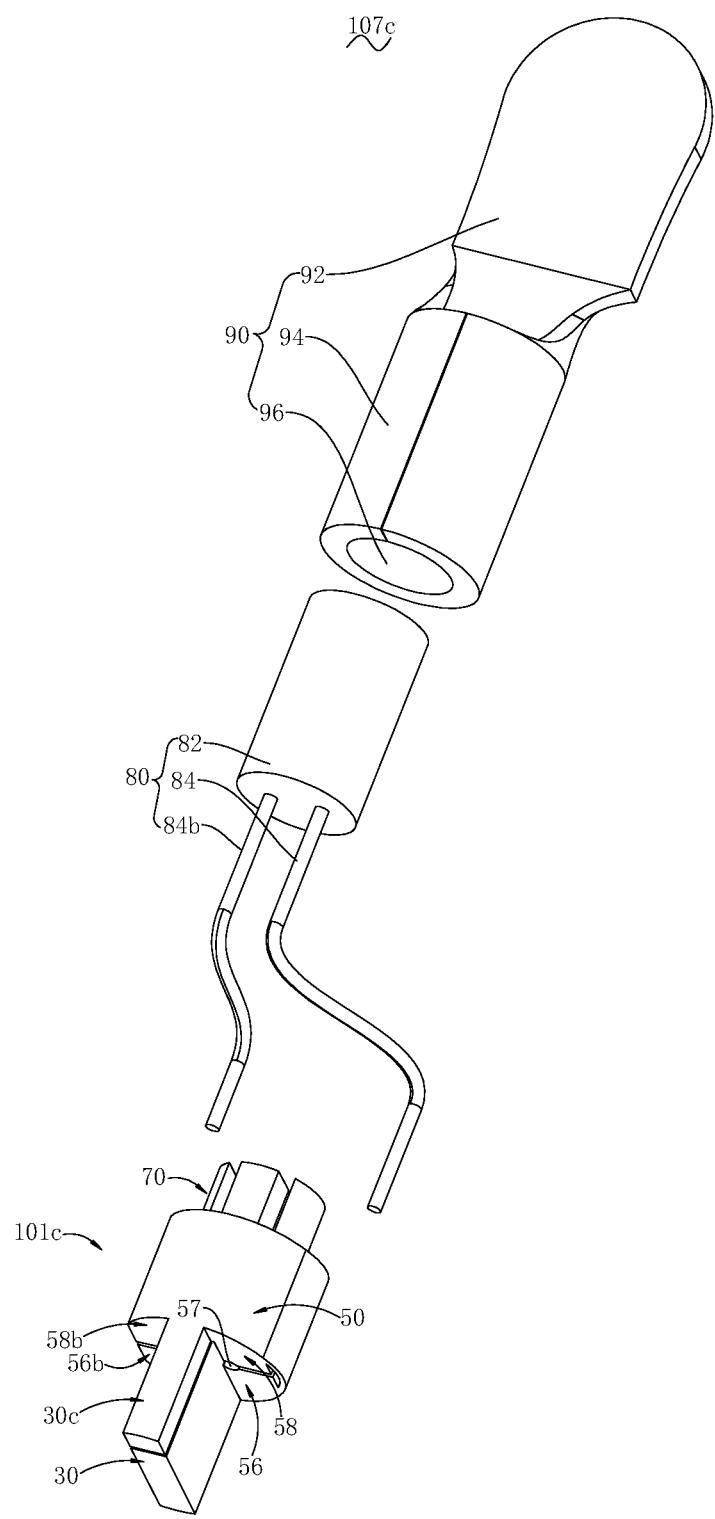
FIG. 20 is a stereoscopic exploded view of the electrical assembly of FIG. 19.

With reference to FIG. 18 and FIG. 19, preferably, a pair of the mating retaining parts 58, 58*b* and the mating isolative wall 30*c* enclose a recess 501. The isolative wall 30 protrudes and extends into the recess 501. The isolative wall 30 is provided between the pair of accommodating parts 52*c*, 52*d*. A recess 501 is provided between the pair of mating accommodating parts 52*e*, 52*f*. The isolative wall 30 protrudes and extends into the recess 501.

Embodiment 4

Figure 21:
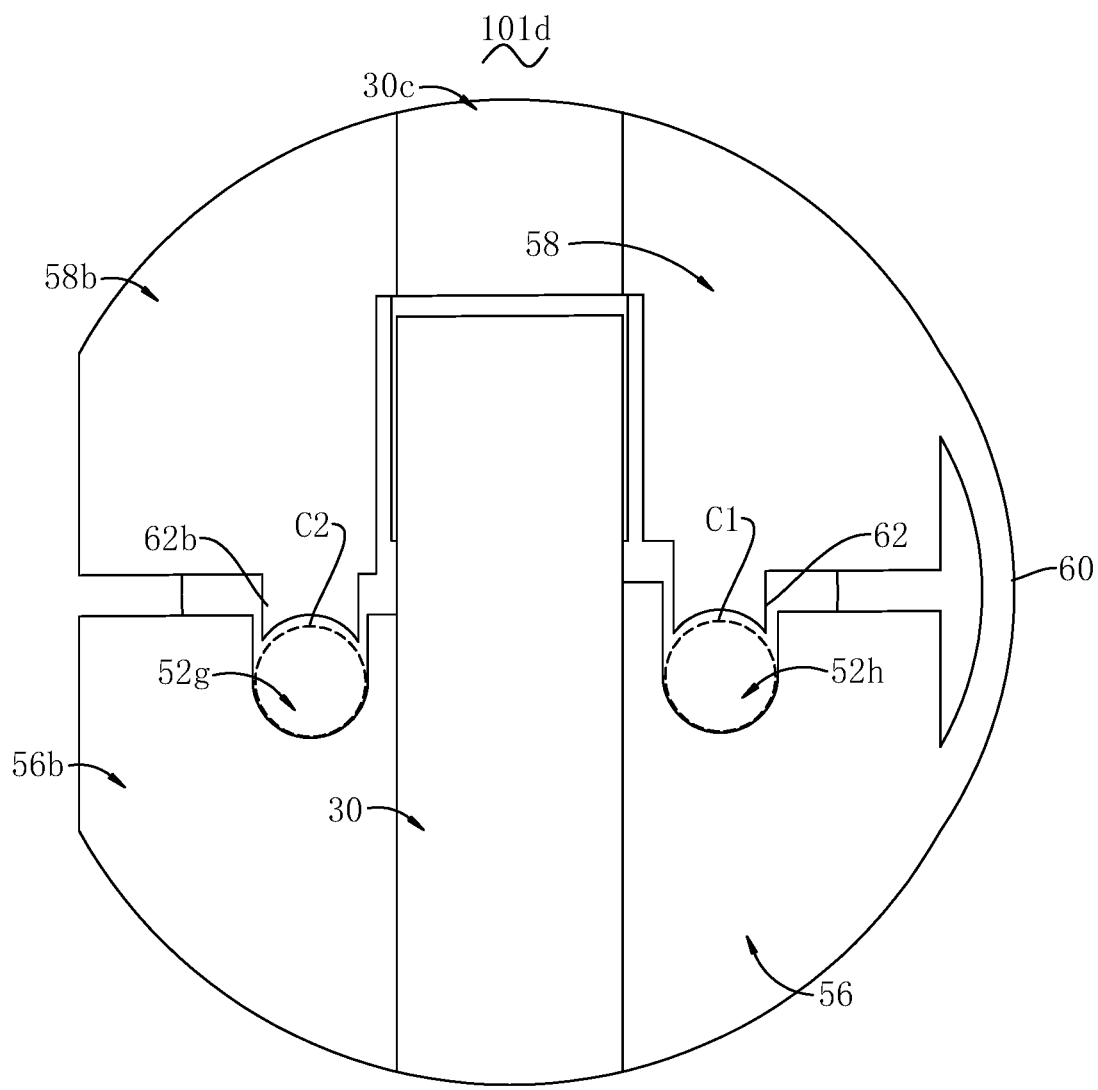
FIG. 21 is a projected view of yet another embodiment of the electronic element support frame of FIG. 15 provided by the present disclosure from a rear end to a front end.

With reference to FIG. 21, as a variation to Embodiment 3, the present disclosure provides yet another electronic element support frame 101*d*. Different from Embodiment 3, blocking parts 62, 62*b* are protrudingly arranged on the mating retaining parts 58, 58*b*. The blocking parts 62, 62*b* may extend into the corresponding accommodating parts 52*g*, 52*h*, so that the pins 84, 84*b* (as will be described infra) may be more firmly retained inside the corresponding accommodating parts 52*g*, 52*h*, thereby preventing the pins 84, 84*b* from escaping from the accommodating parts 52*g*, 52*h*.

At this point, the retaining parts 56, 56*b* and the mating retaining parts 58, 58*b* are mated with each other; i.e., the mating retaining parts 58, 58*b* and the retaining parts 56, 56*b* are top-down oppositely disposed to retain the pins 84, 84*b* described below. The specific shape of the blocking parts 62, 62*b* is only required to be capable of protruding into the corresponding accommodating parts 52*g*, 52*h* and capable of retaining the pins 84, 84*b* with corresponding peripheral wall profiles shown by the circular dotted-lines C1, C2 inside the accommodating parts 52*g*, 52*h*. In this embodiment, to further enhance the accommodating and retaining performance, a depth of the accommodating parts 52*g*, 52*h* (top-down height in the figure) is larger than or equal to a diameter of the pins 84, 84*b*. In other words, the depth of the accommodating parts 52*g*, 52*h* of a U-groove shape is larger than or equal to a radial size of the pins 84, 84*b*.

Embodiment 5

Continuously with reference to FIGS. 4, 13, 17, and 18, the present disclosure further provides an electronic element assembly 105, 105*b*, 105*c*. The electronic element assembly 105 comprises an electronic element 80 and the electronic element support frame 101, 101*b* or 101*c* as described in Embodiment 1, Embodiment 2 or Embodiment 3.

The electronic element 80 comprises a pair of pins 84, 84b. The pair of pins 84, 84b are correspondingly provided at the pair of retaining parts 50, 50b, respectively. Specifically, the pair of pins 84, 84b may be accommodated within the pair of retaining parts 50, 50b of a groove shape. As a variation, the pair of pins 84, 84b may also be inserted into the through-holes 55, 55b of the retaining parts 50, 50b. As a further variation, the pair of pins 84, 84b are accommodated in the through-holes 57, 57b formed by the mating accommodating parts 52e, 52f and the accommodating parts 52c, 52d. Further, the pair of pins 84, 84b continuously extend from an element body 82 (as will be described infra) and successively arranged at the second retaining parts 76, 76b, and the retaining parts 50, 50b. Specifically, the pair of pins 84, 84b are accommodated in the second retaining parts 76, 76b of a groove shape. The pair of pins 84, 84b are arranged to extend axially towards a rear end. The pair of pins 84, 84b are restricted by the isolative wall 30 and disposed at two sides of the isolative wall 30, respectively. In other words, the pair of pins 84, 84b are transversely arranged apart along the isolative wall 30.

The electronic element 80 further comprises an element body 82. The element body 82 is arranged opposite to a front end of the isolative wall 30. The element body 82 is arranged adjacent to an end portion of the body 10, i.e.; the element body 82 is arranged closer to two axial end portions of the body 10, thereby facilitating the arrangement of the pins extending axially. In the embodiment, the element body 82 is arranged opposite to the front end of the mounting end portion 70. The element body 82 is firmly retained on the electronic element support frame 101, 101b or 101c through the pins 84, 84b. The specific dimension and type of the element body 82 may be selected according to needs.

The specific dimension and type of the electronic element 80 may be selected as needed. In this embodiment, the electronic element 80 is a temperature detecting element. In other words, the electronic element 80 may be a temperature sensor. The electronic element 80 may be a thermistor. In this embodiment, the electronic element 80 is an NTC (Negative Temperature Coefficient) thermistor.

Embodiment 6

Continuously with reference to FIGS. 5-10, 14, 19, and 20, the present disclosure further provides an electrical assembly 107, 107b, 107c. The electrical assembly 107 comprises a mating support frame 90 and the electronic element assembly 105, 105b, 105c as described in Embodiment 4. The electronic element assembly 105 is arranged on the mating support frame 90.

The specific shape and structure of the mating support frame 90 are only required to be manufactured into the electronic element assembly 105. In this embodiment, to facilitate integrally assembling and firmly retaining the electronic element 80, the mating support frame 90 has a hole wall 94. The hole wall 94 encloses a mounting hole 96. The shape and structure of the mounting hole 96 are only required to satisfy corresponding mounting requirements. In this embodiment, the mounting hole 96 is an axially extending through-hole.

To facilitate further supporting the electronic element assembly 105, the mating support frame 90 further comprises a connecting part 92. The connecting part 92 is arranged to extend continuously and axially from the hole wall 94. The connecting part 92 may be connected to corresponding components. In this embodiment, the connecting part 92 may be electrically connected to a bus-bar. The connecting part 92 is substantially plate-shaped. The connecting part 92 may be connected to the bus-bar by welding. The bus bar acts as a detected element in the embodiment. As needed, the electronic element 80 may also be applied to other detected elements.

To facilitate manufacturing and obtain stable mechanical strength, the mating support frame 90 is a whole unit. Specifically, the mating support frame 90 is a metallic whole unit. To avoid bimetallic electrochemical corrosion while electrically connecting to the bus-bar, the mating support frame 90 is an aluminum whole unit of the same metal material as that of the bus-bar.

Hereinafter, how to arrange the electronic element assembly 105 on the mating support frame 90 will be illustrated briefly: inserting the mounting end portion 70 into the mounting hole 96. At this point, an element body 82 of the electronic element 80 is also accommodated in the mounting hole 96. The retaining parts 50, 50b may have an inner diameter size larger than that of the mounting hole 96. The retaining parts 50, 50b may be block-fitted to a rear end wall of the mounting hole 96 to thereby avoid excessive assembly.

To enhance the stable performance of the integrally assembled electrical assembly 107, the electrical assembly 107 further comprises a filler 40. The filler 40 fills a gap between the mounting hole 96 and the electronic element assembly 105. The filler 40 may be an adhesive-cured structure. In this embodiment, the filler 40 is a silicone-cured structure to thereby provide good thermal conduction and electrical insulation performance. The filler 40 may be mounted in place from a front opening of the mounting hole 96.

To enhance the stable electrical performance of the electronic element 80, the electrical assembly 107 further comprises a filler (not shown). The filler fills a gap between the mounting hole 96 and the element body 82. In this embodiment, the filler may be a silicone-cured structure.

Figure 2:
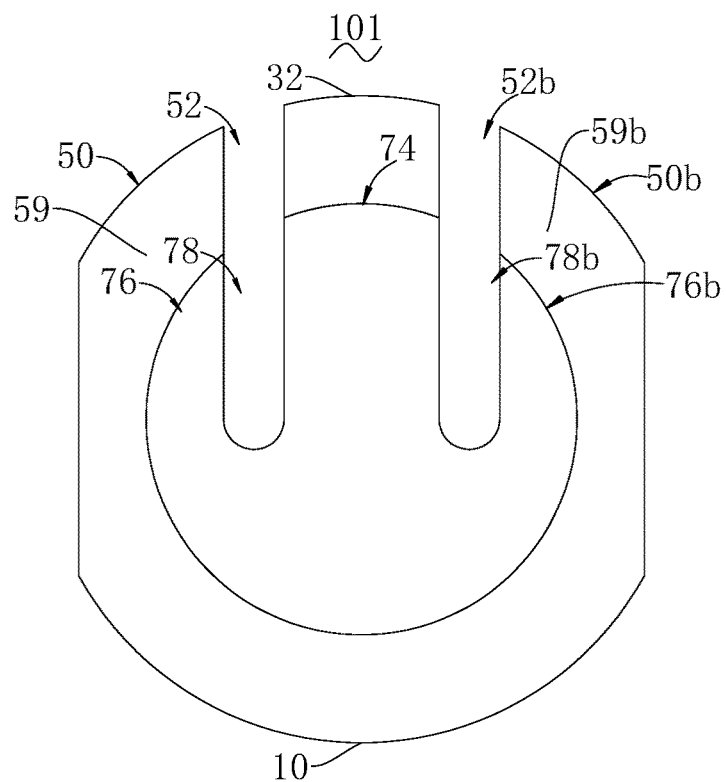
FIG. 2 is a projected view of the electronic element support frame of FIG. 1 with a mounting end portion as shown.
Figure 3:
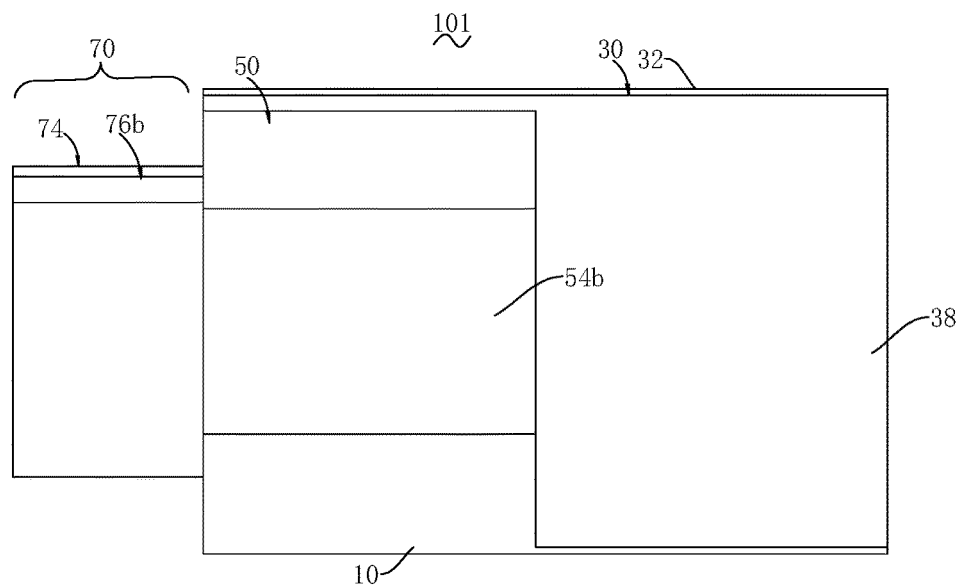
FIG. 3 is a right-side view of the electronic element support frame of FIG. 2.
Figure 4:
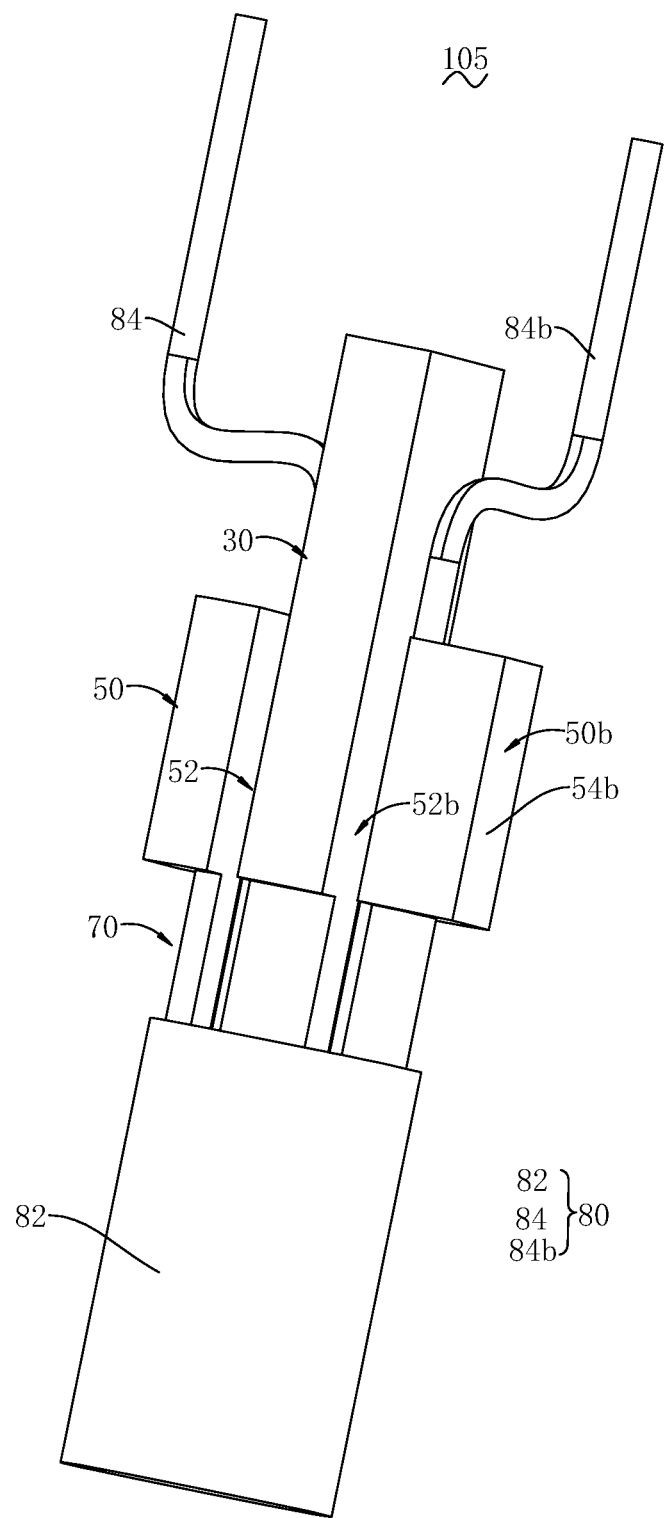
FIG. 4 is a stereoscopic structural diagram of an electronic element assembly provided by the present disclosure.
Figure 5:
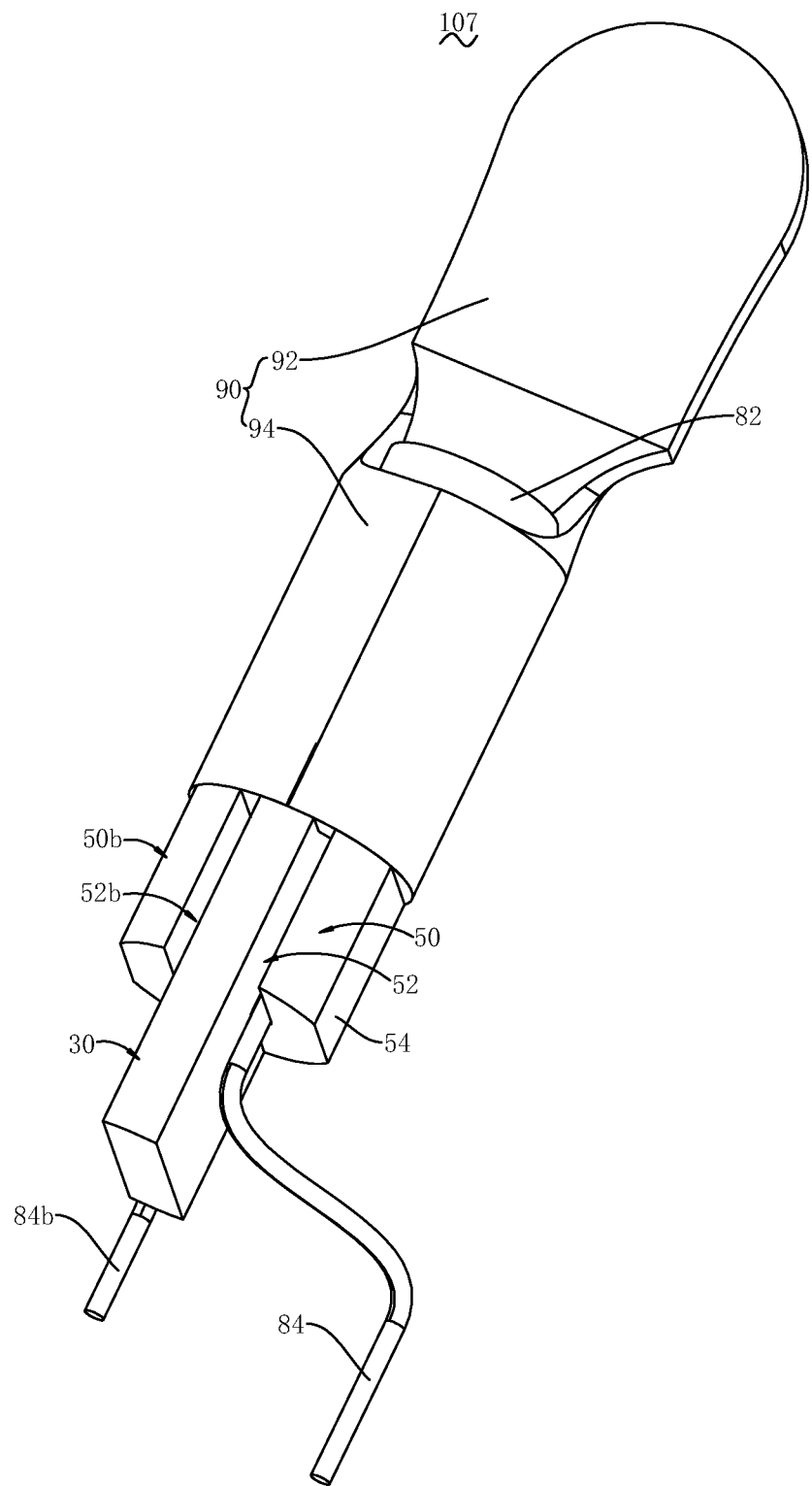
FIG. 5 is a stereoscopic structural diagram of an electrical assembly provided by the present disclosure.
Figure 6:
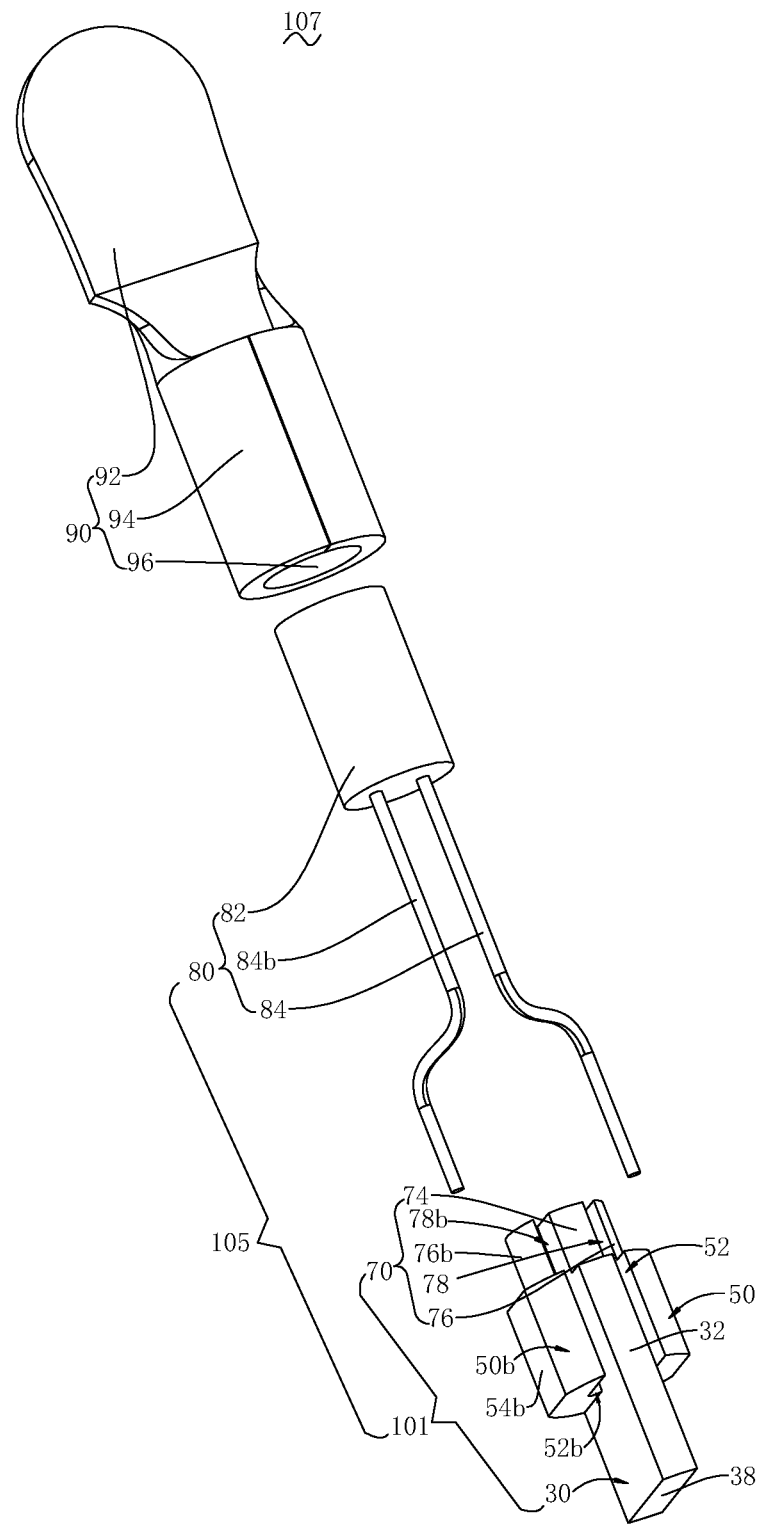
FIG. 6 is a stereoscopic exploded view of the electrical assembly of FIG. 5.
Figure 7:
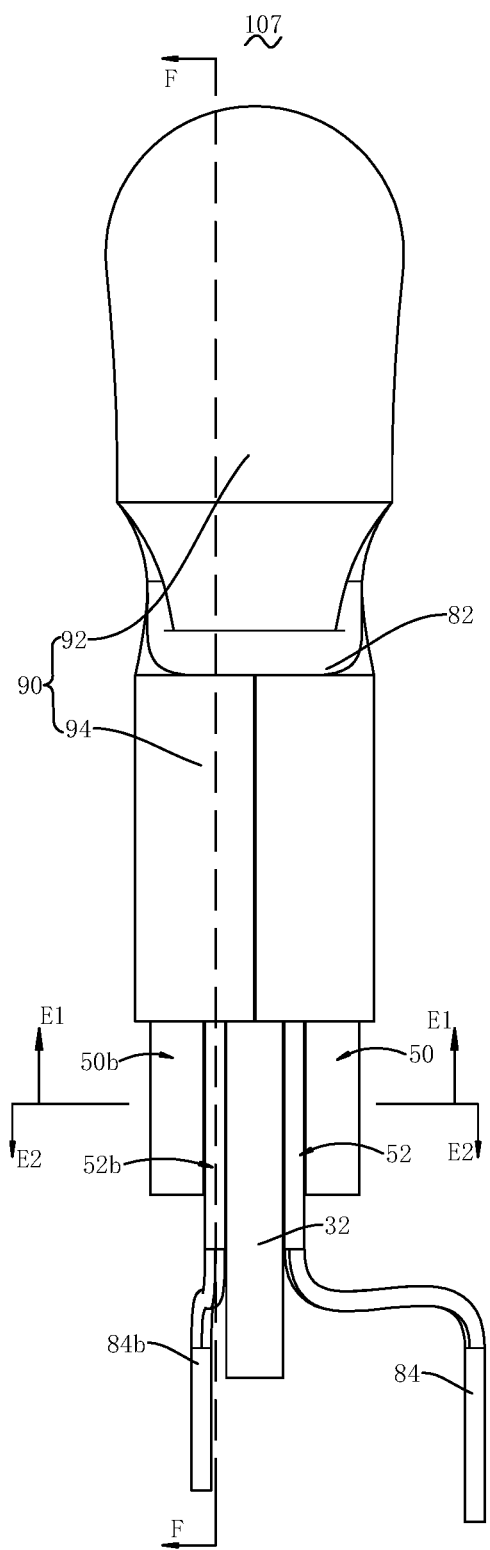
FIG. 7 is a projected view of the electrical assembly of FIG. 5.
Figure 8:
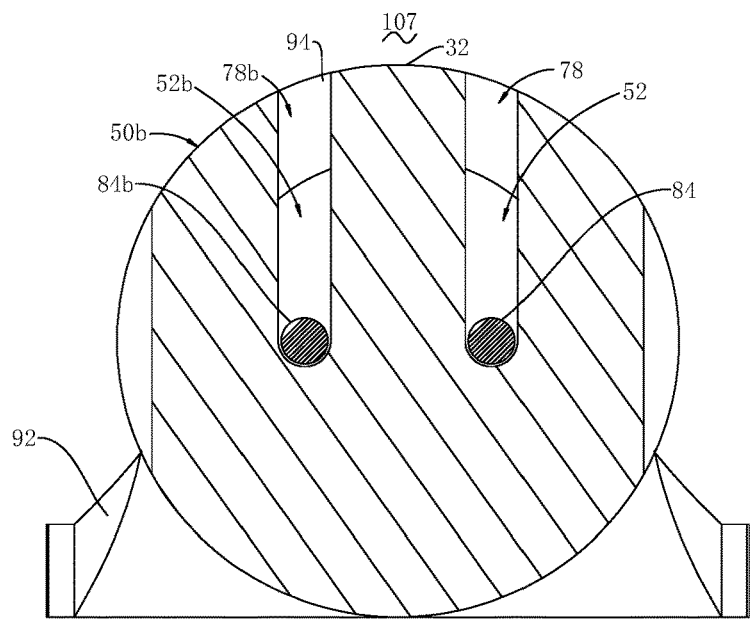
FIG. 8 is a sectional view of the electrical assembly of FIG. 7 along an E1-E1 line.
Figure 9:
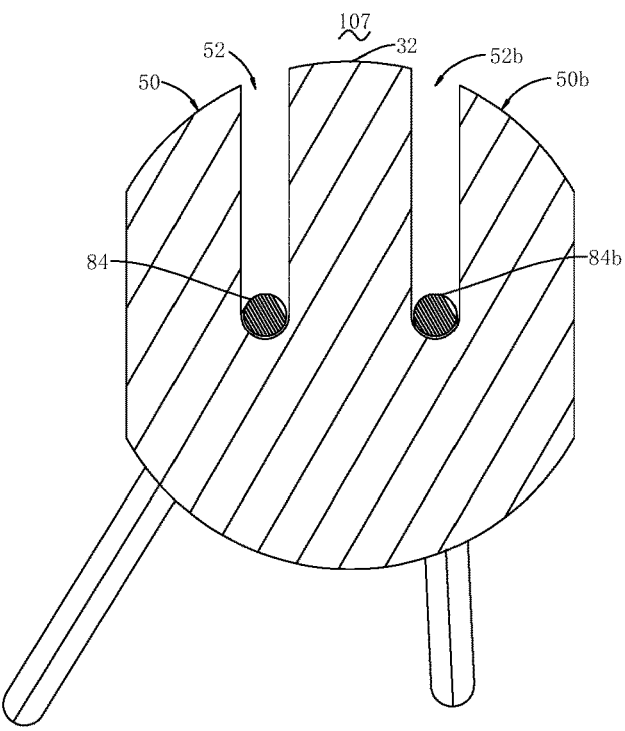
FIG. 9 is a sectional view of the electrical assembly of FIG. 7 along an E2-E2 line.
Figure 10:
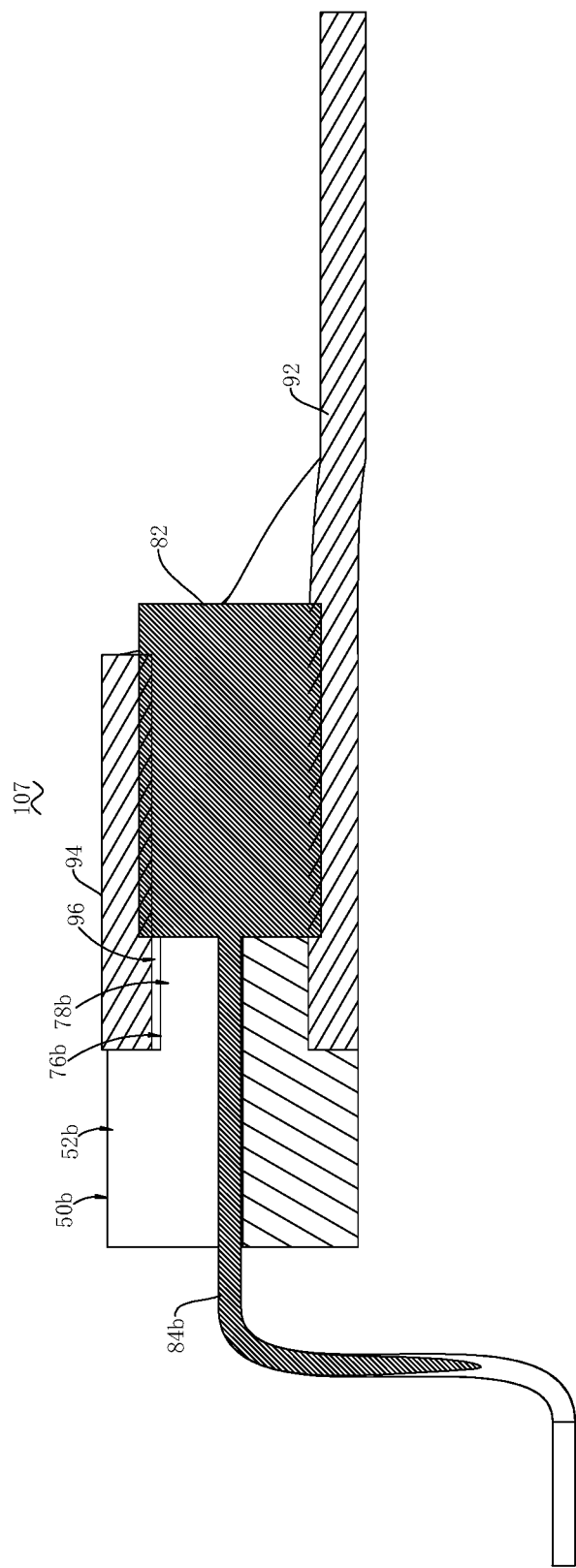
FIG. 10 is a sectional view of the electrical assembly of FIG. 7 along an F-F line.
Figure 11:
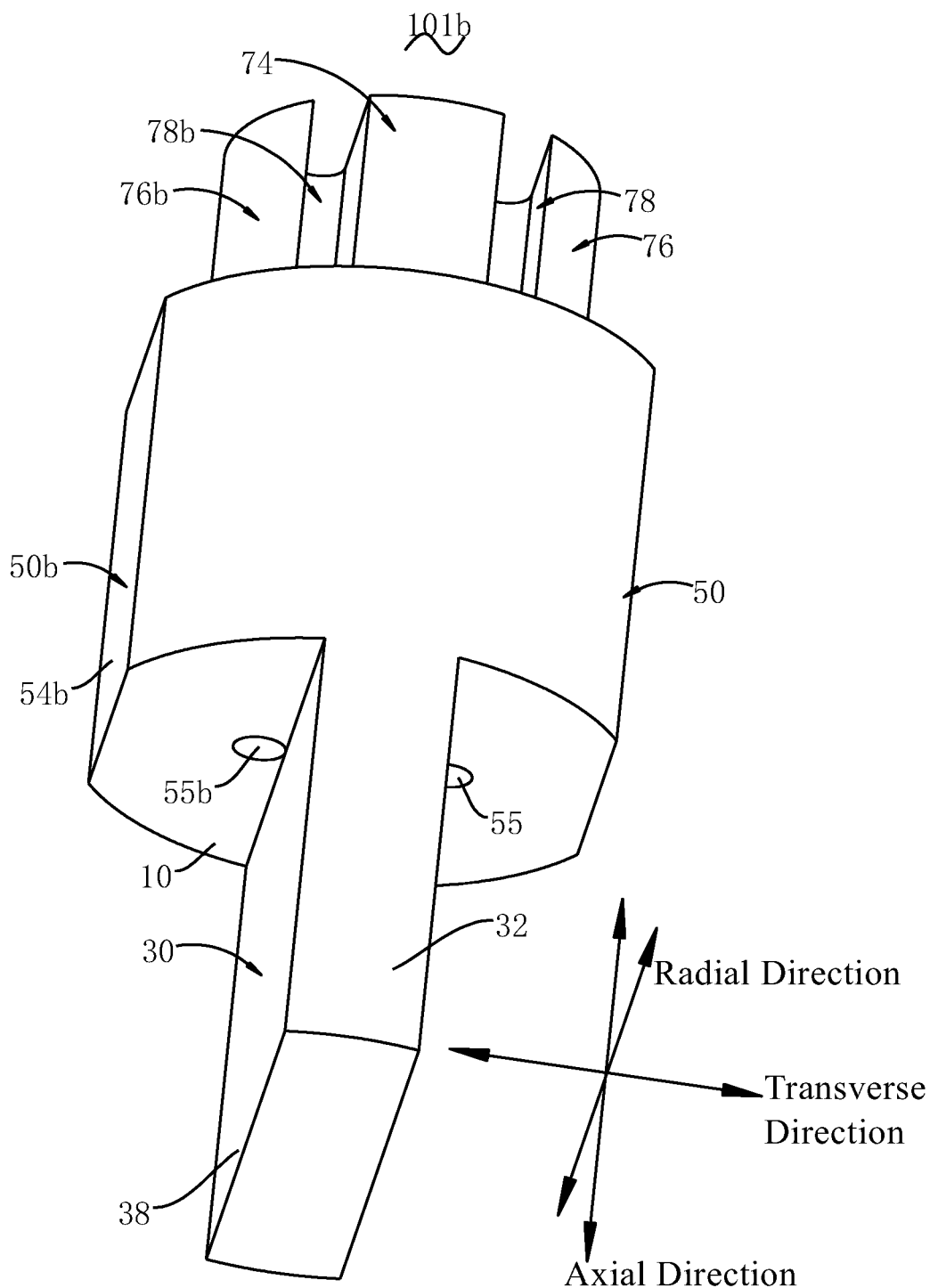
FIG. 11 is a stereoscopic structural diagram of another embodiment of an electronic element support frame provided by the present disclosure.
Figure 12:
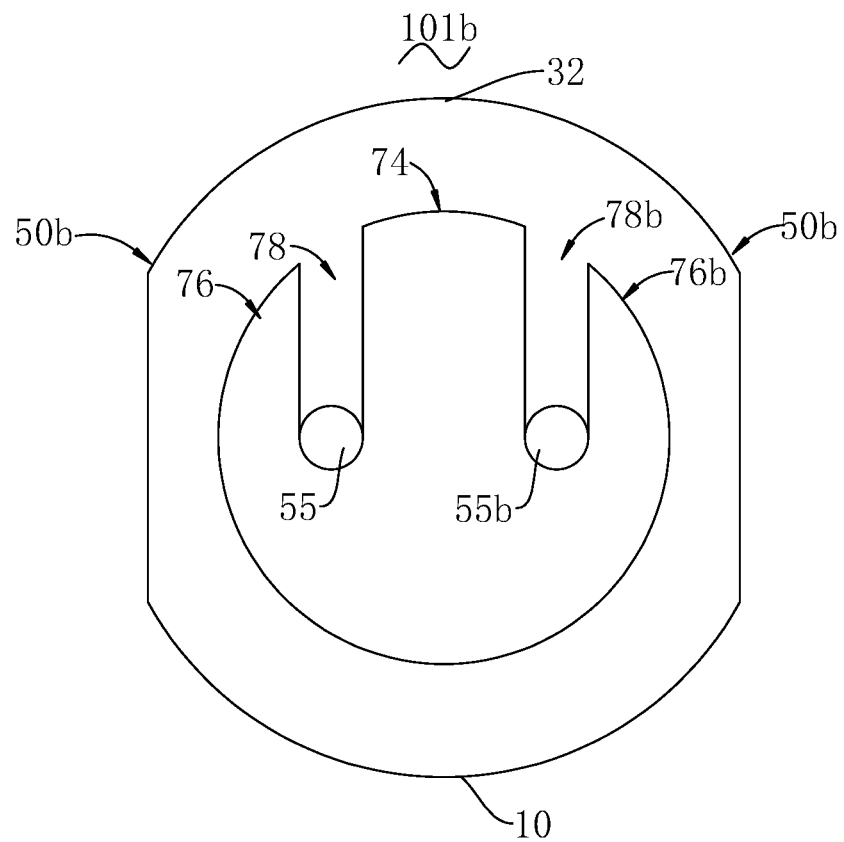
FIG. 12 is a projected view of the electronic element support frame of FIG. 11 from a front end to a rear end.
Figure 13:
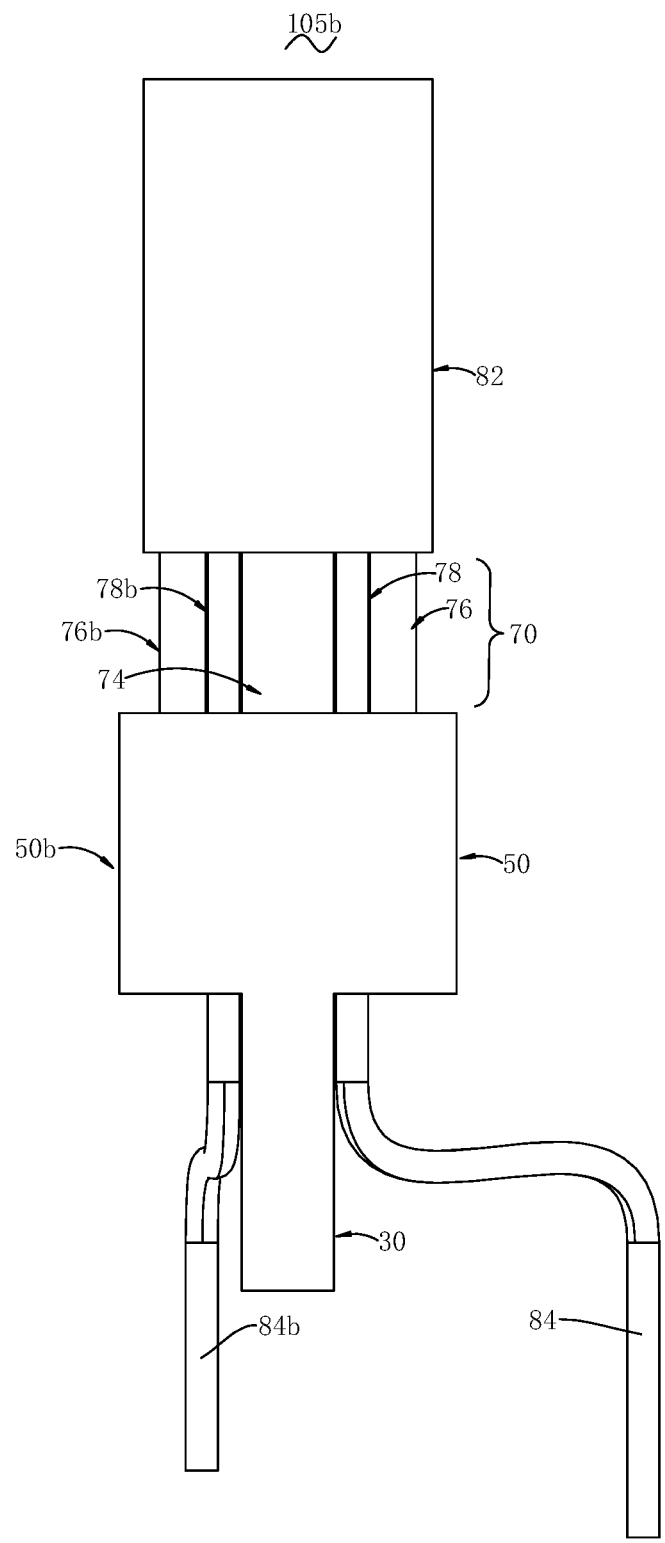
FIG. 13 is a projected view of another embodiment of an electronic element assembly provided by the present disclosure from a top portion to a bottom portion of an insulative wall, the electronic element assembly comprising the electronic element support frame of FIG. 11.
Figure 14:
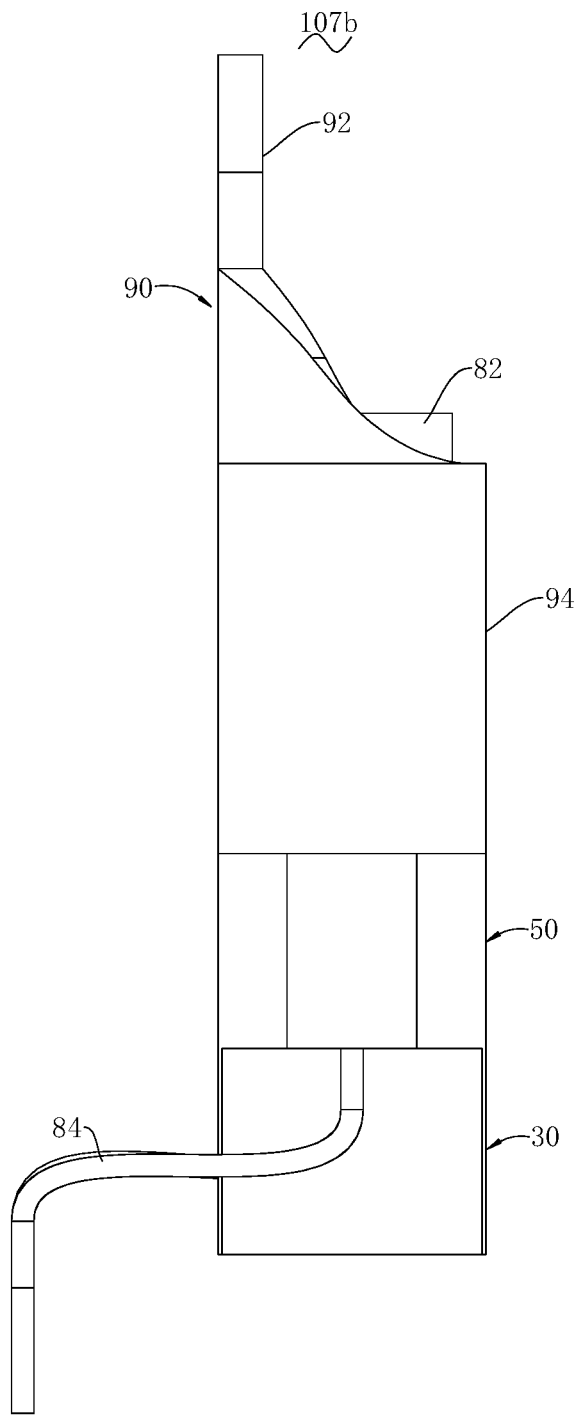
FIG. 14 is a projected view of another embodiment of an electrical assembly provided by the present disclosure from one sidewall to the other sidewall of the isolative wall, the electrical assembly comprising the electronic element assembly of FIG. 13.
Figure 15:
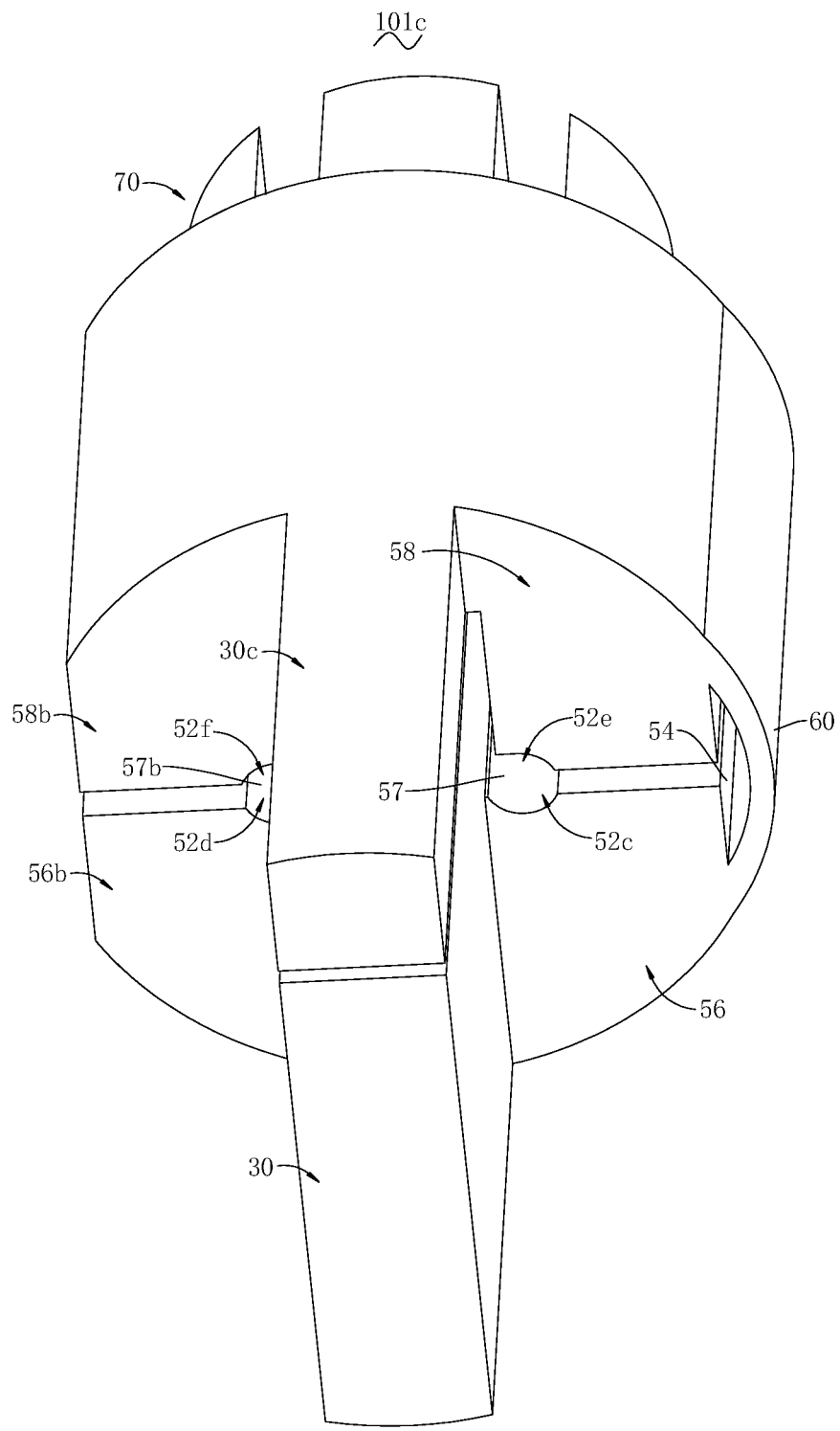
FIG. 15 is a stereoscopic structural diagram of a further embodiment of the electronic element support frame provided by the present disclosure.
Figure 16:
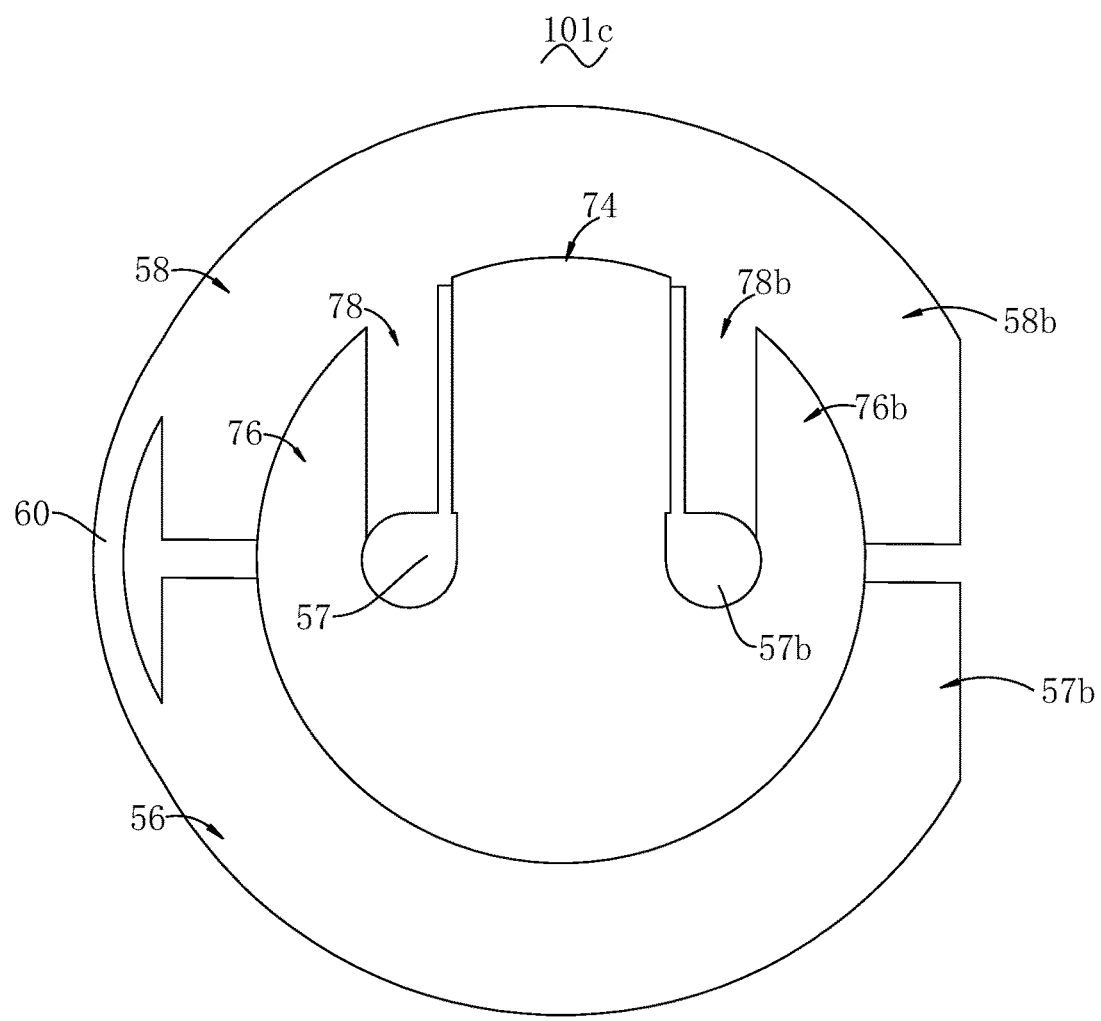
FIG. 16 is a projected view of the electronic element support frame of FIG. 15 from a front end to a rear end.
Figure 17:
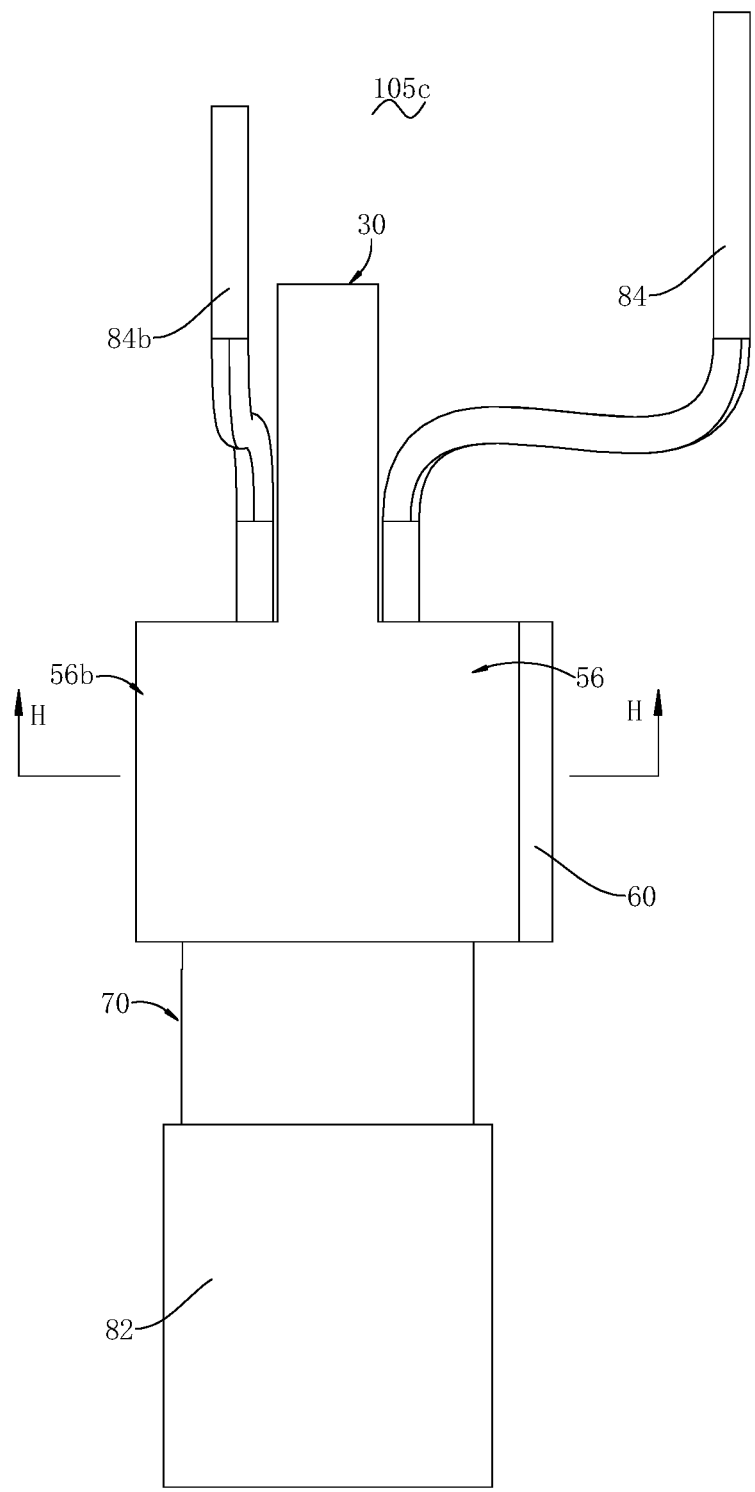
FIG. 17 is a projected view of yet another embodiment of the electronic element assembly provided by the present disclosure from a bottom portion to a top portion of the isolative wall, the electronic element assembly comprising the electronic element support frame of FIG. 15.

It should be noted that, unless otherwise indicated, the term "axial" used herein refers to the left-right direction shown in FIG. 3, or the length direction of the isolative wall 30; the term "radial" refers to the top-down direction of FIG. 3; the term "transverse" refers to the left-right direction shown in FIG. 2. More specifically, FIG. 11 shows the "axial," "transverse," and "radial," directions, any two of which are perpendicular to each other. Additionally, the terms "front" and "rear" are relative concepts, i.e., a direction in which the electronic element support frame 101 is mounted to the mating support frame 90. The above directional qualifiers are only intended to facilitate understanding of the relative positions of various components in the above embodiments with reference to the accompanying drawings.

What have been described above are only preferred embodiments of the present disclosure and are not intended to limit the protection scope of the present disclosure. Any modifications, equivalent substitutions or improvements within the spirit of the present disclosure shall be included within the scope of the claims of the present disclosure.

What is claimed is:

1. An electronic element support frame, comprising:
a body having an axial direction;
an isolative wall arranged to continuously extend along the axial direction of the body; and
a pair of retaining parts arranged on the body and disposed at two sides of the isolative wall, respectively;
wherein the retaining parts together with the isolative wall enclose a pair of accommodating parts; and
wherein the accommodating parts extend continuously along the axial direction of the isolative wall to accommodate pins of the electronic element, respectively.

2. The electronic element support frame according to claim 1, wherein the isolative wall has an axial length larger than that of the retaining parts; and
one or two ends of the isolative wall is arranged to axially protrude from the retaining parts.

3. The electronic element support frame according to claim 1, wherein
the isolative wall is arranged to continuously extend along a radial direction of the body; and
when the pins of the electronic elements are accommodated into the accommodating parts, a top portion of the isolative wall is arranged to protrude from peripheral walls of the pins of the electronic element.

4. The electronic element support frame according to claim 1, further comprising mating retaining parts arranged on the retaining parts.

5. The electronic element support frame according to claim 4, wherein the mating retaining parts and the retaining parts constitute an entire unit.

6. The electronic element support frame according to claim 4, further comprising a rotational connector that is connected to the retaining parts and the mating retaining parts, respectively,
wherein the retaining parts and the mating retaining part are arranged to be rotatable with respect to each other via the rotational connector.

7. The electronic element support frame according to claim 4, wherein
the mating retaining parts have a pair of mating accommodating parts; and
the mating accommodating parts are arranged to be communicatible with the accommodating parts and enclose a through-hole.

8. The electronic element support frame according to claim 7, wherein the mating retaining parts are arranged to be movable relative to the retaining parts and enable the mating accommodating parts to move to be staggered with the accommodating parts.

9. The electronic element support frame according to claim 7, wherein
a mating isolative wall is arranged between the pair of mating accommodating parts; and
the mating isolative wall and the isolative wall are arranged to continuously contact along the axial direction.

10. The electronic element support frame according to claim 7, wherein
a recess is arranged between the pair of mating accommodating parts; and
the isolative wall protrudes and extends into the recess.

11. The electronic element support frame according to claim 4, wherein
a pair of blocking parts are protrudingly provided on the mating retaining parts; and
when the retaining parts and the mating retaining parts are fitted to each other, the pair of blocking parts are arranged to protrude and extend into the pair of accommodating parts, respectively.

12. The electronic element support frame according to claim 1, further comprising a mounting end portion that is provided at an end portion of the body and extends continuously along the axial direction of the body;
wherein the mounting end portion is arranged for being mounted to a mating support.

13. The electronic element support frame according to claim 12, wherein
the mounting end portion comprises a second isolative wall and a pair of second retaining parts;
the second retaining parts are arranged at two sides of the second isolative wall, respectively and enclose second accommodating parts for accommodating the pins of the electronic element, respectively; and
the second accommodating parts and the accommodating parts are arranged to communicate along an axial direction of the isolative wall.

14. The electronic element support frame according to claim 12, wherein an axial end face of the retaining parts facing the mounting end portion is a blocking surface.

15. The electronic element support frame according to claim 1, wherein the accommodating parts open in a radial direction.

16. The electronic element support frame according to claim 1, wherein at least one end of the isolative wall is arranged to axially protrude from the retaining parts.

17. An electronic element assembly, comprising:
an electronic element support frame, which comprises:
a body having an axial direction;
an isolative wall arranged to continuously extend along the axial direction of the body; and
a pair of retaining parts arranged on the body and disposed at two sides of the isolative wall, respectively;
wherein the retaining parts and the isolative wall enclose a pair of accommodating parts extending continuously in the axial direction of the isolative wall;
an electronic element, the electronic element having a pair of pins arranged in the accommodating parts of the electronic element support frame, respectively;
a mating support, the mating support having a mounting hole wall enclosing a mounting hole, in which one end of the electronic element support frame is held; and
a filler, the filler being held in the mounting hole and filling a gap between the electronic element support frame, the electronic element, and the mounting hole wall;
wherein the electronic element support frame, the electronic element, and the mating support are joined to one another as an integral element.

18. The electrical assembly according to claim 17, wherein
the electronic element support frame comprises a mounting end portion formed at an end portion of the body and extending continuously along the axial direction of the body; and
the mounting end portion is received inside the mounting hole of the mating support.

19. The electrical assembly according to claim 18, wherein
the mounting end portion comprises a second isolative wall and a pair of second retaining parts;
the second retaining parts are arranged at two sides of the second isolative wall, respectively and enclose second accommodating parts for accommodating the pins of the electronic element, respectively; and
the second accommodating parts and the accommodating parts are aligned in the axial direction of the isolative wall.

20. The electrical assembly according to claim 18, wherein an axial end face of the retaining parts facing the mounting end portion forms a blocking surface against the mounting hole wall of the mating support.

* * * * *